US011828877B2

(12) United States Patent
Luan (10) Patent No.: US 11,828,877 B2
(45) Date of Patent: Nov. 28, 2023

(54) OPTICAL SENSOR PACKAGE WITH ENCAPSULANT IS BETWEEN AND SEPARATES SUBSTRATES AND MULTIPLE ASSEMBLIES

(71) Applicant: STMicroelectronics PTE LTD, Singapore (SG)

(72) Inventor: Jing-En Luan, Singapore (SG)

(73) Assignee: STMicroelectronics PTE LTD, Singapore (SG)

( * ) Notice: Subject to any disclaimer, the term of this patent is extended or adjusted under 35 U.S.C. 154(b) by 386 days.

(21) Appl. No.: 17/015,521

(22) Filed: Sep. 9, 2020

(65) Prior Publication Data
US 2021/0080547 A1 Mar. 18, 2021

Related U.S. Application Data

(60) Provisional application No. 62/899,339, filed on Sep. 12, 2019.

(51) Int. Cl.
*G01S 7/481* (2006.01)
(52) U.S. Cl.
CPC .................. *G01S 7/4813* (2013.01)
(58) Field of Classification Search
CPC .... G01V 8/12; G01J 1/02; G01J 1/021; G01J 1/06; H01L 31/16; H01L 31/17; H01L 31/02; G01S 17/04; G01S 7/48; G01S 17/06; G02B 26/02

USPC .................................................. 250/221, 239
See application file for complete search history.

(56) References Cited

U.S. PATENT DOCUMENTS

| 7,061,292 | B2 | 6/2006 | Maksimovic et al. |
| 7,663,095 | B2 | 2/2010 | Wong et al. |
| 9,312,402 | B2 | 4/2016 | Tu et al. |
| 9,525,093 | B2 * | 12/2016 | Costello .............. G01D 11/305 |
| 9,997,645 | B2 | 6/2018 | Tsukagoshi |
| 10,115,878 | B2 | 10/2018 | Horikawa |

* cited by examiner

*Primary Examiner* — Que Tan Le
(74) *Attorney, Agent, or Firm* — SEED INTELLECTUAL PROPERTY LAW GROUP LLP (57) ABSTRACT

The present disclosure is directed to an optical sensor package with a first assembly and a second assembly with an encapsulant extending between and coupling the first assembly and the second assembly. The first assembly includes a first substrate, a first die on the first substrate, a transparent material on the first die, and an infrared filter on the transparent material. The second assembly includes a second substrate, a second die on the second substrate, a transparent material on the second die, and an infrared filter on the transparent material. Apertures are formed through the encapsulant aligned with the first die and the second die. The first die is configured to transmit light through one aperture, wherein the light reflects off an object to be detected and is received at the second die through another one of the apertures.

20 Claims, 8 Drawing Sheets

OPTICAL SENSOR PACKAGE WITH ENCAPSULANT IS BETWEEN AND SEPARATES SUBSTRATES AND MULTIPLE ASSEMBLIES

BACKGROUND

Technical Field

The present disclosure is directed to an optical sensor package, and more particularly, to an optical sensor package with a resin enclosing the package.

Description of the Related Art

Optical sensor packages are known for converting light rays into electronic signals. Typically, optical sensor packages are a cavity type package with a cap coupled to a substrate and a cavity or space between the cap and semiconductor devices on the substrate. The cap includes openings, such that a light emitting die on the substrate emits light rays through one opening in the cap to be received by a light receiving die on the substrate through another opening in the cap. In operation, an object to be detected by the optical sensor interrupts or reflects light rays from the light emitting die, which results in a different amount or intensity of light received at the light receiving die compared to an operating condition when no object is present for detection. Reflection of the light rays when an object is present results in variance in an amount of light rays, or characteristics of the light rays (e.g., intensity, among others), received at the light receiving die. The variance in the light rays results in a variance in electronic signals corresponding to the detected light rays. The variance in the electronic signals as a result of reflection off of an object is read by an instrument to determine the distance or proximity, among other characteristics, of the object relative to the sensor package.

However, known optical sensor packages suffer from several disadvantages. For example, the presence of the cap and the cavity in the package results in packages with a larger size, which is counter to general market trends towards smaller electronic devices. In other words, in modern electronic devices, space is at a premium, which makes larger packages significantly less preferred. In some applications, low profile optical sensor packages are required due to a design form factor of an electronic device and thus larger packages may not be usable. In addition, attachment of the cap to the substrate results in gluing processes during manufacturing that increase cost. Further, the gluing or coupling interfaces between the cap and substrate often experience cracking or other damage over time. The material of the cap and the material of the substrate are usually different and have different coefficients of thermal expansion. As such, during repetitive operation cycles of the package, the cap and the substrate will expand and contract different amounts in response to the heat produced during operation, which localizes stress and strain at the cap and substrate interfaces. Over time, the forces acting on the cap and substrate interfaces can lead to cracking at the interfaces or even separation of the cap from the substrate, either of which can result in package malfunction or failure.

BRIEF SUMMARY

The present disclosure is directed to an optical sensor package with an over-molded encapsulant such as a resin encapsulating one or more assemblies. More specifically, the optical sensor package includes a light emitting assembly and a light receiving assembly with a resin on the light emitting assembly and the light receiving assembly. The light emitting assembly includes a substrate and a semiconductor die on the substrate, which may be a light emitting die such as a die with one or more light emitting diodes ("LED") or a vertical cavity surface emitting laser ("VCSEL") die, for example. A transparent resin is on the light emitting die and an infrared filter is on the transparent resin. The light receiving assembly includes a substrate and a semiconductor die on the substrate, which may be a light receiving die such as a die including a photodiode. The light receiving assembly also includes the transparent resin on the light receiving die and an infrared filter on the transparent resin.

The over-molded resin encapsulates the light emitting assembly and the light receiving assembly to couple the light emitting assembly to the light receiving assembly. In one example, the resin is coplanar with a surface of the substrate of both the light emitting assembly and the light receiving assembly and extends between the light emitting assembly and the light receiving assembly. A first aperture is formed in the resin aligned with the light emitting die and a second aperture is formed in the resin aligned with the light receiving die. As such, during operation, light is emitted by the light emitting die and received by the light receiving die, which converts the light rays impinging on the light receiving die into electronic signals. Use of an over-molded resin instead of a cap reduces or eliminates the above deficiencies of known cavity type packages, as described in more detail below.

BRIEF DESCRIPTION OF THE SEVERAL VIEWS OF THE DRAWINGS

For a better understanding of the embodiments, reference will now be made by way of example only to the accompanying drawings. In the drawings, identical reference numbers identify similar elements or acts. In some figures, the structures are drawn exactly to scale. In other figures, the sizes and relative positions of elements in the drawings are not necessarily drawn to scale. For example, the sizes, shapes of various elements and angles may be enlarged and positioned in the figures to improve drawing legibility.

DETAILED DESCRIPTION

FIGS. 1-5 illustrate various views of one or more embodiments of a package 100, which may be an optical sensor package. With reference to FIGS. 1-5, the package 100 includes a first surface 102 (which may be referred to herein as an upper or top surface) and a second surface 104 (which may be referred to herein as a lower or bottom surface) opposite the first surface 102. The package 100 further includes a first assembly 106 and a second assembly 108. The first assembly 106 is coupled to the second assembly 108 by an encapsulant material (which may be a resin material, and which may be referred to herein as a resin 110), which is over-molded on the assemblies 106, 108 to at least partially encapsulate the assemblies 106, 108 and form the package 100, as described herein. The assemblies 106, 108 may also be referred to herein as packages, sub-packages, sub-assemblies, systems, sub-systems, semiconductor devices, semiconductor packages, or other like terms. The resin 110 may also be referred to herein as an encapsulant, molding compound, or an over-molded resin, among other like terms.

The resin 110 includes a first aperture 112 extending through the resin 110 and a second aperture 114 extending through the resin 110. In other words, the first aperture 112 extends through the resin 110 from the first surface 102 of the package 100 to the first assembly 106 and the second aperture 114 extends through the resin 110 from the first surface of the package 110 to the second assembly 108.

Figure 1:
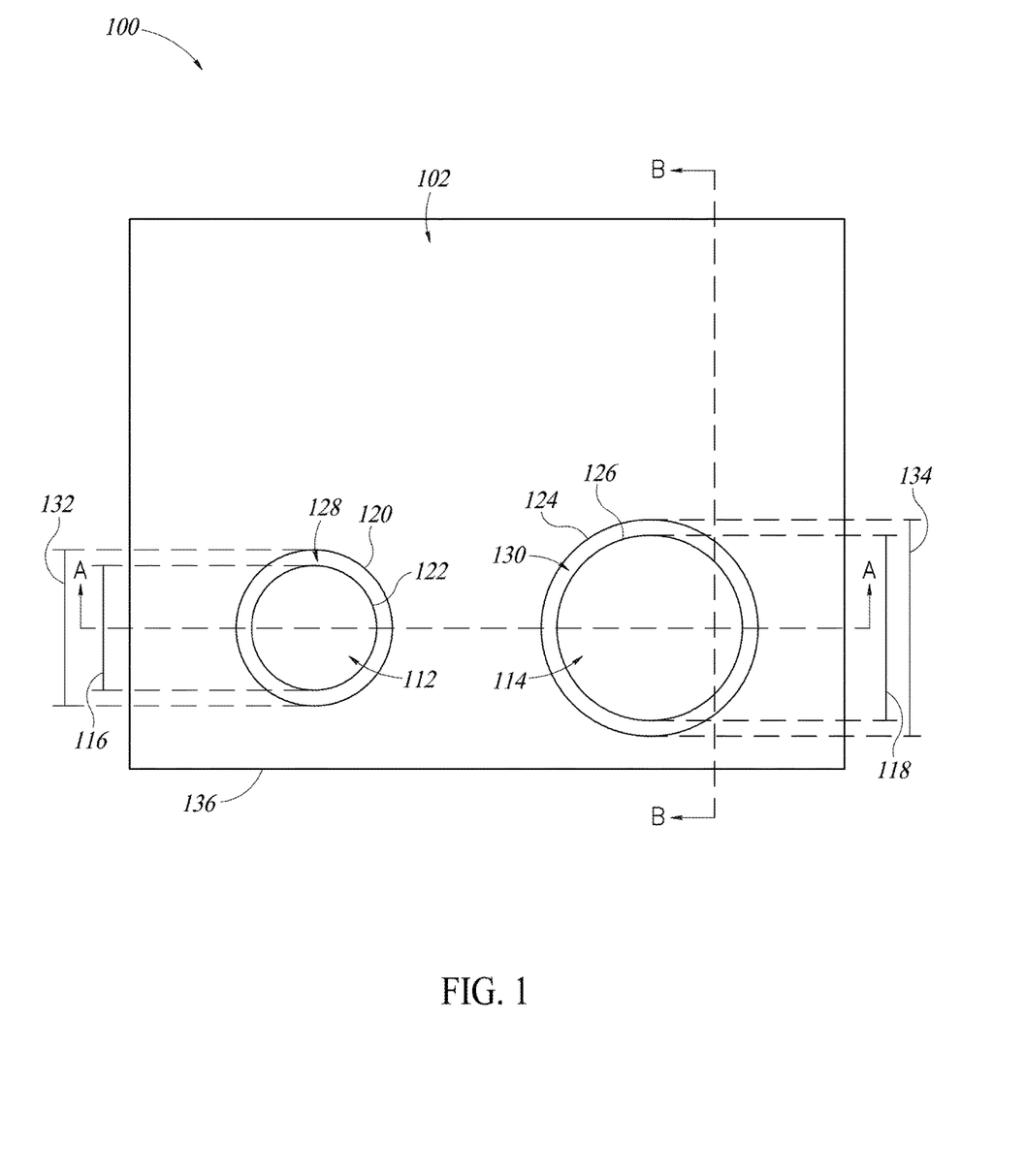
FIG. 1 is a plan view of a first surface of an embodiment of an optical sensor package according to the present disclosure with a light emitting assembly and a light receiving assembly encapsulated with resin.
Figure 2:
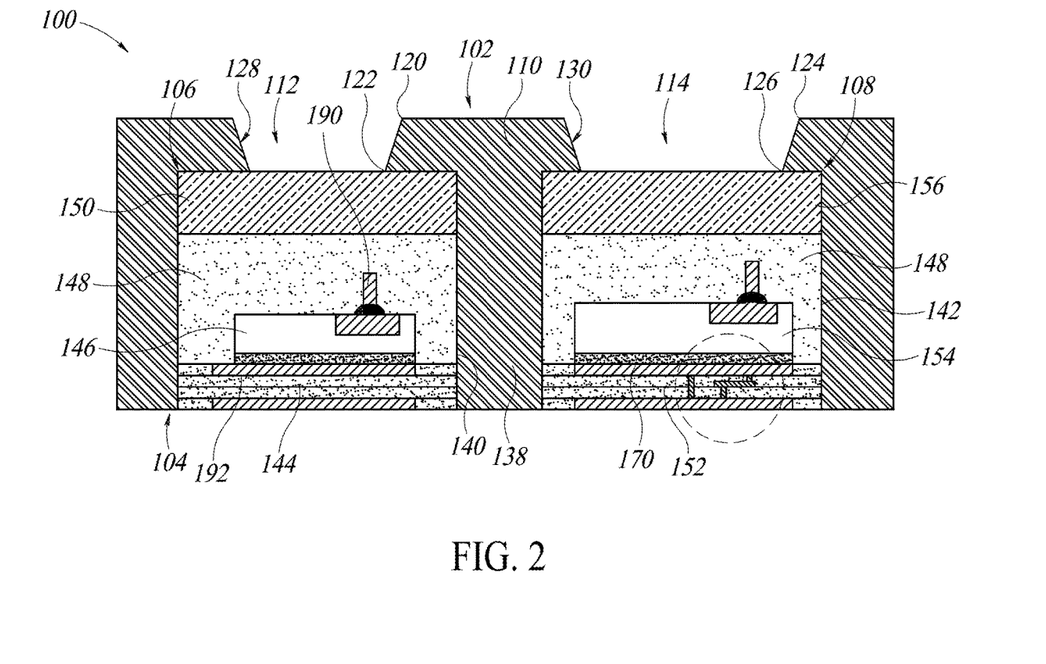
FIG. 2 is a cross-sectional view of the optical sensor package of FIG. 1 along the line A-A in FIG. 1.

The resin 110 further includes a first edge 120 and a second edge 122 extending around the first aperture 112 and a third edge 124 and a fourth edge 126 extending around the second aperture 114. As shown in FIGS. 1-2, the first edge 120 and the third edge 124 are coplanar with the first surface 102 of the package 100. The second edge 122 is coplanar with the first assembly 106 and the fourth edge 126 is coplanar with the second assembly 108.

In one embodiment, the first aperture 112 has a dimension 116 between outermost points of the second edge 122 of the resin 110 and the second aperture 114 has a dimension 118 between outermost points of the fourth edge 126 of the resin 110, wherein the dimension 116 is less than the dimension 118. In the embodiment shown in FIG. 1, which is a plan view of the package 100 illustrating the first surface 102 of the package 100, each of the apertures 114, 116 are circular and thus the dimensions 116, 118 may be a diameter. In other embodiments, the apertures 112, 114 have a different geometric shape, such as a square or rectangle, for example, in which case the dimensions 116, 118 may be a length or width. In yet further embodiments, the dimensions 116, 118 are the same or the dimension 116 is greater than the dimension 118. As such, the size and shape of each aperture 112, 114 can be selected according to design preference.

A first sidewall 128 (which may be referred to herein as a first sidewall surface 128) extends between the first and second edges 120, 122 and a second sidewall 130 (which may be referred to herein as a second sidewall surface 130) extends between the third and fourth edges 124, 126. In one embodiment, the sidewalls 128, 130 are at angle to horizontal that is 15 degrees or approximately 15 degrees. In other words, the sidewalls 128, 130 are transverse to the first surface 102 of the package 100 (e.g. at an angle to the first surface 102 that is not equal to 0 degrees and not equal to 90 degrees).

The angle of the sidewalls 128, 130 can be selected according to design preference. For example, in further embodiments, the sidewalls 128, 130 are at an angle to horizontal that is between 3 and 45 degrees, or between 3 and 30 degrees, or between 3 and 20 degrees, or between 5 and 15 degrees. In yet further embodiments, the sidewalls 128, 130 are at an angle to horizontal between 0 and 90 degrees. The sidewalls 128, 130 assist with dispersing light from the assembly 106 and focusing light to the assembly 108, in one embodiment. The aperture 112 (or resin 110 defining the aperture 112) includes the dimension 116, which may be referred to as a first dimension 116 and a second dimension 132 between outermost points of the first edge 120 and the aperture 114 (or resin 110 defining the aperture 114) includes the dimension 118, which may be referred to as a first dimension 118 and a second dimension 134 between outermost points of the third edge 124. In some embodiments, the second dimension 132 of the first aperture 112 is greater than the first dimension 116 of the first aperture 112 and the second dimension 134 of the second aperture 114 is greater than the first dimension 118 of the second aperture 114. Further, the second dimension 134 of the second aperture 114 may be greater than the second dimension 132 of the first aperture 112.

In one or more embodiments, the sidewalls 128, 130 are flat and planar and as such, the dimensions of the first aperture 112 continuously increase from the first dimension 116 to the second dimension 132 and similarly, the dimensions of the second aperture 114 continuously increase from the first dimension 118 to the second dimension 134. Put another way, a height of the resin 110 relative to the assemblies 106, 108 continuously increases from the assemblies 106, 108 to the first surface 102 of the package 100 across the sidewalls 128, 130. In one or more embodiments, a distance from the first edge 120 of the resin 110 to an outer edge 136 of the package 100 is less than a distance from the second edge 122 of the resin 110 to the outer edge 136 of the package 100. Similarly, a distance from the third edge 124 of the resin 110 to the outer edge 136 of the package 100 is less than a distance from the fourth edge 126 of the resin 110 to the outer edge 136 of the package 100. In other embodiments, the sidewalls 128, 130 may be curved, may include multiple chamfered or curved surfaces formed through etching, or may have a step down configuration. Further, FIG. 1 illustrates that the package 100 is rectangular in one embodiment, although it is to be appreciated that in other embodiments, the package 100 can be selected to be square, circular, or other geometric or irregular shapes.

Figure 5:
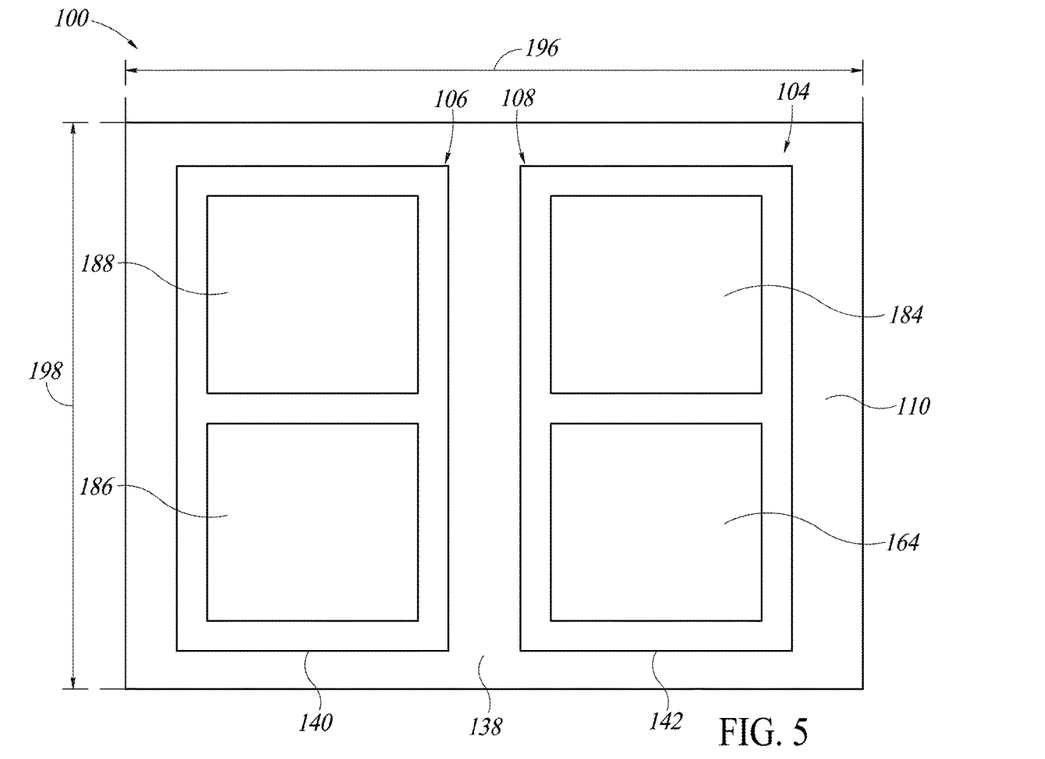
FIG. 5 is a plan view of a second surface of the optical sensor package of FIG. 1.

FIG. 2, which is a cross-sectional view of the package 100 along line A-A in FIG. 1, further illustrates that the resin 110 includes a portion 138 extending between and coupled to both of the assemblies 106, 108. Each of the assemblies 106, 108 includes respective sidewalls 140, 142. In one embodiment, the first assembly 106 includes four sidewalls 140 and the second assembly 108 also includes four sidewalls 142. FIG. 5, which is a plan view of the second surface 104 of the package 100, illustrates that the resin 110 is on all of the sidewalls of the assemblies 106, 108. Returning to FIG. 2, the portion 138 of the resin 110 extends between sidewalls 140, 142 of the assemblies 106, 108 and is contact with the sidewalls 140, 142 of the assemblies 106, 108, such that the portion 138 of the resin 110 couples the assemblies 106, 108 together. Described another way, the resin 110 is a single, continuous layer of material, which may include one or more of a thermosetting resin, a thermoplastic material, a molding compound, or an epoxy resin, alone or in combination, as well as one or more phenolic hardeners, silicas, catalysts, pigments, and mold release agents. As such, the resin 110 encapsulates the assemblies 106, 108 with the portion 138 preferably being a single, continuous, unitary part of the resin 110 extending between the assemblies 106, 108 from the first surface 102 of the package 100 to the second surface 104 of the package 100 along the respective lengths of the assemblies 106, 108 (see FIG. 5).

The first assembly 106 further includes a substrate 144, a first die 146 on the substrate 144, a transparent material such as a transparent resin 148 on the die 146 and the substrate 144, and a first filter 150 on the transparent resin 148. The resin 110 is on the first filter 150 of the first assembly 106 and in contact with the transparent resin 148 and the substrate 144 at sidewalls 140 of the first assembly 106. The second assembly 108 further includes a substrate 152, a second die 154 on the substrate 152, the transparent resin 148 on the second die 154 and the substrate 152 and a second filter 156 on the transparent resin 148 of the second assembly 108. The resin 110 is on the second filter 156 of the second assembly 108 and in contact with the transparent resin 148 and the substrate 152 at sidewalls 142 of the second assembly 108. Details of the substrates 144, 152 will be described in additional detail with reference to FIGS. 3 and 4.

In one or more embodiments, the first assembly 106 is a light emitting assembly and the second assembly 108 is a light receiving assembly. As such, the first die 146 of the first assembly 106 is configured to emit light rays, which may be light rays in the visible spectrum of light, in the infrared spectrum of light, or in the ultraviolet spectrum of light, among others. In some embodiments, the first die 106 may be an LED die or a vertical cavity surface emitting laser (VCSEL) die.

In embodiments where the first die 146 is an LED die, the first die 146 may include a substrate including one or more of Aluminum, Gallium, Arsenic, Nitride, Silicon, or Phosphor, among other available substrate materials. In some embodiments, dopants are added to the substrate to increase conduction through the substrate. It is to be appreciated that the composition of the first die 146 can be selected according to desired output, namely the color or type of light emitted by the die 146. In general, the LED die preferably includes a first portion with a dopant that results in extra negatively charged particles (or electrons) in the first portion, which is referred to as an N-type material, portion, or section of the first die 146. The LED die also includes a second portion with a dopant that results in extra holes (or positively charged particles) in the second portion, which is referred to as a P-type material, portion, or section of the first die 146. The LED includes N-type material bonded to P-type material with electrodes on each end, which allows for conduction of electricity in one direction through the die 146.

The electrode corresponding to the N-type material is connected to a negative current and the electrode of the P-type material is connected to a positive current. The free electrons in the N-type material are repelled by the negative current and drawn to the positive electrode. The holes in the P-type material move the opposite direction (e.g. are repelled by the positive current and are drawn towards the negative electrode). When no current is applied, the electrons of the N-type material settle in the holes of the P-type material and prevent conduction of electricity through the LED die. However, when adequate current is applied as above, the electrons of the N-type material are removed from the holes of the P-type material and begin moving freely, and electric current moves across the diode.

Photons are a form of energy released by atoms. In certain instances, this energy is visible as light. In an atom, electrons move in orbitals around the nucleus, where electrons in different orbitals have different amounts of energy. For an electron to change orbitals, an exterior force or energy source has to change the energy level of the electron. With LED dies, free electrons move across the diode, as above, and fall into empty holes in the P-type material, which involves an energy drop to a lower orbital, in which case, the electrons release energy in the form of photons. The amount of energy released depends on the type of material of the diode, wherein certain types of material release photons that are within the visible spectrum of light, while others release photons in the infrared or ultraviolet spectrum. As such, when the first die 146 is an LED die, the first die 146 includes one or more of the above materials along with certain dopants, such that electrons move across the die 146 and release energy in the form of photons as free electrons in the die 146 change orbital levels. The photons are emitted as light rays from the die 146.

In one or more embodiments where the first die 146 is a VCSEL type die, the die 146 may be a top emission type VCSEL, although in other arrangements, the die 146 is a bottom emission type VCSEL. In general, VCSEL dies are configured to emit laser light and include a substrate, which may include any of the materials described above with respect to LED dies, and two distributed Bragg reflector ("DBR") mirrors parallel to the substrate with one or more quantum wells for laser light generation between the DBRs. DBR mirrors consist of layers with alternating high and low refractive indices. Each layer has a thickness of a quarter of the laser wavelength in the material, which results in a reflectivity above 95-99% or more. High reflectivity mirrors are preferred for VCSELs to balance the short axial length of a gain region.

As such, where the die 146 is a VCSEL type die, the die 146 includes a first and second mirror, which may also be referred to as an upper and lower mirror. The upper and lower mirrors are doped as p-type and n-type materials, as above, which forms a diode junction. In other structures, the p-type and n-type regions may be embedded between the mirrors, which can eliminate electrical power loss in the DBR structure. The quantum well between the layers can confine quasi-particles (typically electrons or holes) in a dimension perpendicular to a surface of the layer, whereas movement in other dimension is not restricted. The confinement produces a quantum effect that changes the density states for the confined particles. The quantum well is a thin layer of semiconductor material embedded between other semiconductor layers of wider band gap. The semiconductor materials are selected for the layers such that electrons available for conduction in the middle layer have lower energy than those in the outer layers, which creates an energy dip or well that confines electrons in the middle layer.

A thickness of the middle layer can be between 5 and 20 nanometers, which is made possible through molecular beam epitaxy or metal-organic chemical vapor deposition. This thickness is comparable with a wavelength of the electrons confined within the middle layer, thereby modifying electron behavior, since the electrons are confined with a 2D plane rather than in a bulk 3D sample. As such, during operation, an electrical current is provided to the p-type doped DBR, which flows through the quantum well to the n-type doped DBR. Conduction through the quantum well results in electrons in the middle layer finding holes, which releases photons, as above. Because the electrons are confined within the middle layer, it is easier for the electrons to find holes than with other types of diodes. The released photons are reflected to a large extent (up to 99.9% in or more embodiments) back into the die 146 by the DBRs, with a small portion of the released photons escaping the die perpendicular to the major surfaces of the die 146. The light released by VCSEL dies is typically circular wherein the larger output aperture of VCSELs (e.g. a major surface of the die 146) produces a lower divergence angle, which allows for use of VCSELs without additional optical elements in the optical path.

In yet a further embodiment, the die 146 is an edge emitting VCSEL die including cleaved sections of semiconductor material that act as reflectors, in which case the light oscillates parallel to the layers and escapes at sides of the die instead of at a top or bottom surface of the die, as with the VCSEL dies described above. Although the die 146 has been described as including only a single LED or a single VCSEL arrangement, it is to be understood that in other embodiments, the die 146 includes an array of LEDs or an array of VCSELs in the die 146.

The second die 154 may be a sensor die or a light sensor, such as a photodiode or an array of photodiodes, which converts light into an electrical current. The current is generated when photons released by the light emitting assembly 106 and the die 146 are absorbed in the photodiode. The photodiode includes a p-n junction (e.g. layers of p-type doped material connected with layers of n-type doped material). In one or more embodiments, an intrinsic undoped layer is between the n and p layers. When the die 154 is not in operation (e.g. no light impinges on the die 154), electrons from the n-doped region fill holes in the p-type region at the junction between the p and n regions, which prevents current from passing through the die 154 and forms what is called a depletion zone or region of the die 154. Then, when light (photons) from the light emitting assembly 106 impinge on the die 154, they release energy to the depletion region, which removes the electrons of the n-type region from the holes of the p-type region. Then, the electrons flow towards a positive electrode of the die 154 and the holes flow towards a negative electrode of the die 154, which generates a measurable photocurrent. The intensity of light incident on the die 154 will release different amounts of energy to the die 154 (e.g., more light or more intense light equals more energy released), and as such, the measurable photocurrent corresponds to an intensity of light incident on the die 154. The second die 154 can include one or more of Silicon, Germanium, Indium, Gallium, Arsenide, or Phosphide, among others, wherein the material composition of the second die 154 can be selected according to design specification.

In an embodiment, the package 100 is a time-of-flight sensor. During operation, light emitted by the first die 146 is reflected off an object in a light path of the first die 146 and received by the second die 154. The light received by the second die 154 is converted to an electronic signal, as described herein. A difference between a time the light is emitted by the first die 146 and a time the light is received by the second die 154 can be used to calculate a distance of the object relative to the package 100. In further embodiments, the package 100 is configured to determine other characteristics of the object, such as velocity (e.g., change in distance of the object relative to the package 100 over a time period) or acceleration (e.g., change in velocity of the object relative to the package 100 over a time period), among others.

Figure 3:
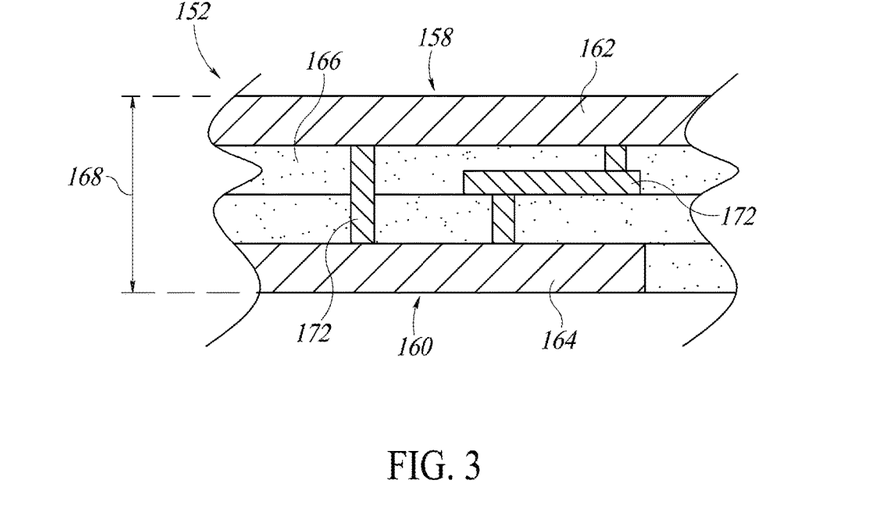
FIG. 3 is an enlarged view of a portion of a substrate of a light emitting assembly of the optical sensor package of FIG. 1.

FIG. 3 is an enlarged view of a portion of the substrate 152 of the second assembly 108. In an embodiment, the substrate 152 of the second assembly 108 is the same as or similar to the substrate 144 of the first assembly 106, and as such, repetitive description has been omitted. In other embodiments, the substrates 144, 152 are different. In some embodiments, the substrate 152 is a land grid array ("LGA") type substrate. LGA substrates are similar to flip-chip Ball Grid Array ("BGA") substrates, except LGA substrates typically do not include solder balls or spheres, as shown in FIG. 3. LGA substrates and BGA substrates may also be referred to as printed circuit board ("PCB") substrates, which include layers of dielectric material or layers of metal and dielectric material. As such, LGA substrates and BGA substrates have a similar structure, except for the contacts of the substrate. LGA substrates may be a type of PCB including flat land grid contacts and BGA substrates may be a type of PCB including solder balls coupled to flat land grid contacts. The substrate 152 includes a first surface 158 and a second surface 160 opposite the first surface 158, with a die pad 162 and a contact pad 164, wherein the contact pad 164 is exposed on the second surface 104 of the package 100, as shown in FIG. 2.

LGA substrates are a type of surface-mount packaging substrate for integrated circuits that can be coupled to a larger electronic device substrate, such as a further PCB, by forming interconnects with solder paste between the contact pad or pads 164 and the PCB during board level assembly processes. This results in a lower stand-off height of approximately 0.06 mm to 0.10 mm or less, depending on solder paste volume and PCB geometry. Alternatively, LGAs can be received in a socket on the PCB. In the illustrated embodiment, the substrate 152 includes four layers 166 of dielectric material, while in other embodiments, the substrate 152 includes only two layers of dielectric material. It may be possible to select the number of layers 166 of dielectric material in the substrate 152, but it is preferable to select either a two layer substrate 152 for lower power, lower performance applications to reduce package size or a four layer substrate 152 for higher power, higher performance applications. In various embodiments, the substrate 152 (as well as the substrate 144 of the first assembly 106) may have any number of layers, which may include any number of dielectric layers, metallization or conductive layers, or any other layers suitable for use as the substrate.

The die pad 162 occupies at least a portion of one layer 166 of the substrate 152 and the contact pad 164 occupies another layer 166 of the substrate 152 in the illustrated embodiment. In other embodiments, e.g., where the substrate 152 includes two layers, the die pad 162 and the contact pad 164 may occupy less than a thickness of each layer. In embodiments where the substrate 152 is a two layer LGA substrate, a thickness 168 of the substrate 152 is preferably between 80 and 100 micrometers or microns. Where the substrate 154 is a four layer LGA substrate, the thickness 168 may be between 160 and 200 micrometers, or more or less. As shown in FIG. 2, the second die 154 is coupled to the die pad 162 with solder 170 or other die attach material. As such, the second die 154 is electrically connected to the die pad 162, which may be electroless gold plating over electroless nickel, for example. Alternatively, the die pad 162 may include one or more of gold, nickel, silver, tin, copper, or lead, or alloys thereof. The die pad 162 is electrically connected to the contact pad 164, which may have a similar composition to that of the die pad 162, by conductive traces 172 (e.g., metallization layers, conductive vias, or the like) through the substrate 152. The traces 172 can extend along layers 166, as well as through layers 166 between the die pad 162 and the contact pad 164. As such, the second die 154 can be electrically connected to a separate PCB or other device during final assembly through the solder 170, the die pad 162, the traces 172, and the contact pad 164.

In other embodiments, the substrate 154 may be a BGA substrate, which has a similar composition to the LGA substrate described above, except solder balls or spheres are coupled to the contact pad 164 for mounting on a PCB or other device during board level assembly processes. In some embodiments, the substrate 154 may be or include a PCB, including a single sided PCB (one metal layer), a double sided PCB (two metal layers on both sides of one substrate or dielectric layer), or a multi-layer PCB (outer and inner layers of metal, alternating with layers of substrate or dielectric). The substrate or dielectric material of such PCB substrates can be FR-2 (phenolic paper or phenolic cotton paper impregnated with phenol formaldehyde resin), FR-4 (woven fiberglass cloth impregnated with epoxy resin), Aluminum or insulated metal substrate clad with thermally conductive thin dielectric, or a flexible substrate, such as polyimide foils or polyimide-fluoropolymer composite foils. Other PCB substrate materials are available as well, including other variations of impregnated papers and woven fiberglass impregnated with epoxy resin, as well as polyimides.

Figure 4:
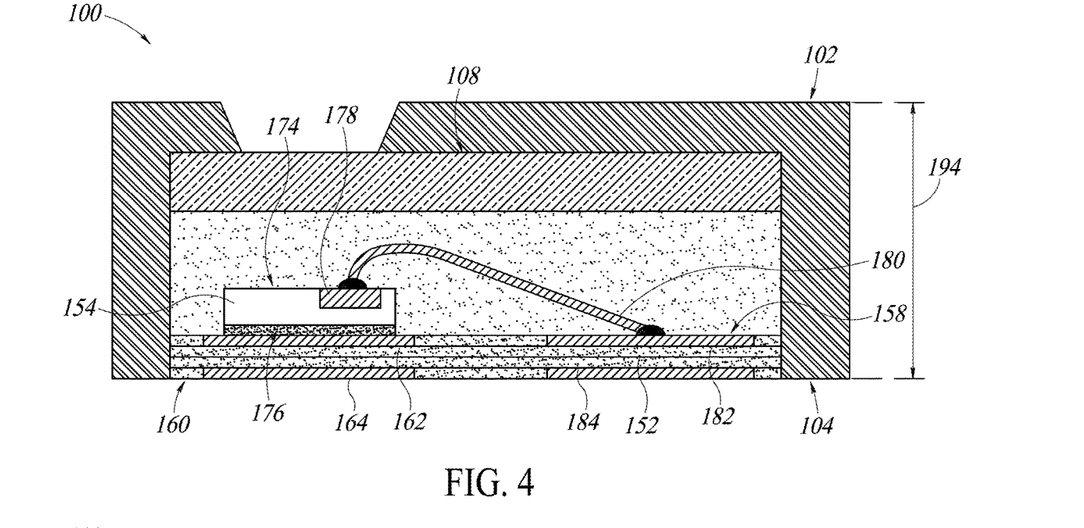
FIG. 4 is a cross-sectional view of the optical sensor package of FIG. 1 along the line B-B in FIG. 1.

FIG. 4 is a cross-sectional view of the package 100 along line B-B in FIG. 1 illustrating the second assembly 108 in additional detail. In an embodiment, the cross-sectional view of the first assembly 106 is the same as the cross-sectional view of the second assembly 108 in FIG. 4 and as such, repetitive description has been omitted. The second assembly 108 includes the second die 154 on the substrate 152 and more specifically, on the die pad 164 of the substrate 152. The second die 154 includes a first surface 174 and a second surface 176 opposite the first surface 174. The second die 154 further includes a contact 178, which in an embodiment, is between the first and second surfaces 174, 176 of the die 154 and coplanar with the first surface 174 of the second die 154.

In other embodiments, the contact 178 is on the first surface 174 of the second die 154. A wire 180 is electrically connected between the contact 178 of the second die 154 and a second contact pad 182 of the substrate 152. In one or more embodiments, the wire 180 is bonded to the second contact pad 182 of the substrate 152 and the contact 178 of the second die 154 with solder in a wire bonding process. In other embodiments, the wire 180 is an ink printed wire formed from a paste containing entrained metal particles and printed along a sublimation layer, wherein sintering or heating solidifies the wire and removes the sublimation layer. The wire 180 can include one or more of gold, nickel, silver, tin, copper, or lead, and alloys thereof. The second contact pad 182 of the substrate 152 is electrically connected to a third contact pad 184 of the substrate 152 through traces similar to traces 172 in FIG. 3.

FIG. 4 further illustrates that each of the contacts 162, 164, 182, 184 of the substrate 152 are between the first and second surfaces 158, 160 of the substrate 152 and coplanar with the respective surfaces 158, 160 of the substrate 152. In other embodiments, the contacts 162, 164, 182, 184 are on the surfaces 158, 160 of the substrate. As such, the second assembly 108 includes four substrate contacts 162, 164, 182, 184, with two contacts 162, 164 corresponding to the second die 154 and two contacts 182, 184 corresponding to the wire 180. The second die 154 is electrically connected to the contacts 182, 184 of the substrate 152 through the wire 180. It is to be appreciated that the first assembly 106 similarly includes four total contacts with a similar arrangement to that shown in FIG. 4 with respect to the second assembly 108.

FIG. 5 illustrates the second surface 104 of the package 100. In an embodiment, the second surface 104 is a bottom or connection surface of the package 100. The package 100 includes the assemblies 106, 108, each having contacts exposed on the second surface 104 of the package 100. For example, the first assembly 106 includes a first contact 186 and a second contact 188 coplanar with the second surface 104 of the package 100. The contacts 186, 188 of the first assembly 106 correspond with a die pad 192 internal to the package 100 for the first die 146 and a wire 190 coupled to the first die 146 and a contact of the first assembly 106 similar to contact 182 of the second assembly 108, as in FIG. 2. As such, the package 100, in some embodiments, includes eight total contacts, with four contacts per assembly 106, 108.

With reference to FIGS. 4 and 5, in one embodiment, the package 100 has a dimension 194 from the first surface 102 to the second surface 104 of the package that is equal to 400 micrometers (microns) or approximately 400 micrometers. The dimension 194 may also be referred to herein as a height or thickness of the package 100. In other embodiments, the dimension 194 ranges from 300 micrometers to 1 millimeter, while in yet further embodiments, the dimension 194 ranges from 600 micrometers to 1 millimeter. In some embodiments, the dimension 194 of the package 100 is less than 1 millimeter. By comparison, known cavity type optical sensor packages have a thickness of at least 1 millimeter or more, and more typically, have a thickness between 1.2 to 1.5 millimeters. As such, the packages of the present disclosure are considerably smaller and lower profile, as the elimination of the cavity and the cap in package 100 allows the package 100 to have a low profile relative to known cavity type optical sensor packages. Further, the package 100 has a length 196 and a width 198, wherein the length is 3 millimeters or approximately 3 millimeters, in one or more embodiments. Similarly, the width 198 is also 3 millimeters or approximately 3 millimeters, in one or more embodiments where the package 100 has a square shape. In the illustrated embodiment, the length 196 is greater than the width 198 and as such, the length 196 may be between 3.1 millimeters and 3.3 millimeters, while the width 198 is 3 millimeters such that the package has a rectangular shape. In alternative embodiments, the length 196 is less than the width 198.

FIGS. 6A-6I illustrate an embodiment of a method 200 for assembling an optical sensor package, such as package 100, according to the present disclosure. The method 200 begins in FIG. 6A with a substrate 202. The substrate 202 may be pre-assembled or manufactured, such that it is ready for assembly without further modification. The substrate 202 is a two layer LGA substrate, in an embodiment. In other embodiments, the substrate 202 is a four layer LGA substrate, a BGA substrate, or a PCB. The substrate 202 includes a first surface 204 opposite a second surface 206 with a first plurality of contact pads 208 coplanar with the first surface 204 and a second plurality of contact pads 210 coplanar with the second surface 206. The pluralities of contact pads 208, 210, may collectively be referred to as contacts or a plurality of contacts of the substrate 202. As illustrated, the contacts 208, 210 are between the first and second surfaces 204, 206 of the substrate 202, with a surface 212 of each contact 208, 210 coplanar with a respective surface 204, 206 of the substrate 202. In other embodiments, the contacts 208, 210 are on the surfaces 204, 206 of the substrate 202.

Figure 6A:
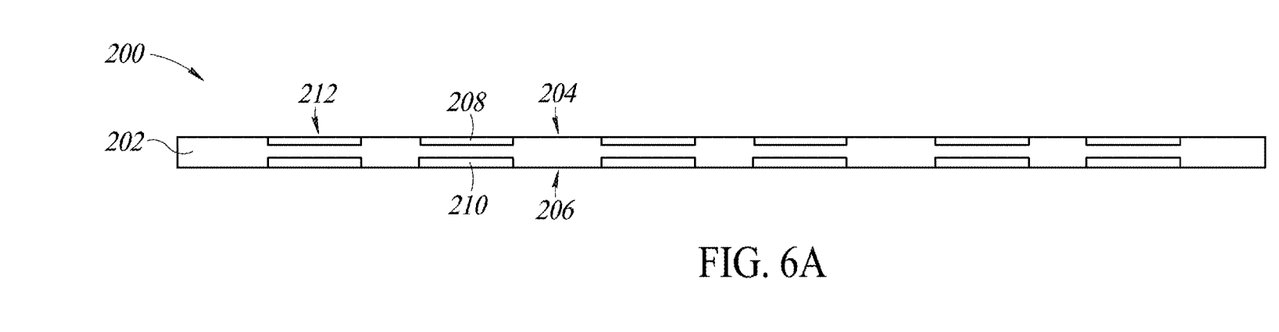
FIGS. 6A-6I are cross-sectional views of an embodiment of a method of assembling an optical sensor package with multiple assemblies encapsulated by resin according to the present disclose.
Figure 6B:
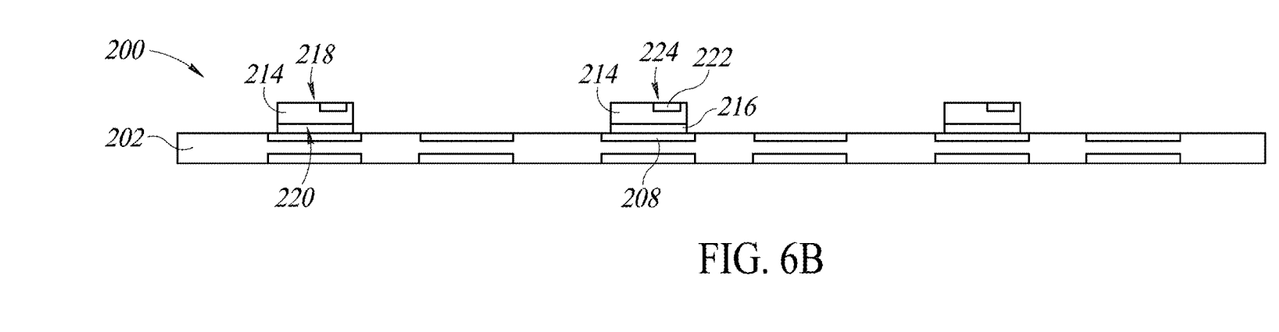

The method 200 continues in FIG. 6B with a die attach process. More specifically, a first die 214 is attached to the substrate 202 with a die attach material 216. In one embodiment, the die attach material 216 is solder, while in other embodiments, the die attach material is some other conducive or non-conductive adhesive, such as glue or tape. The first die 214 includes a first surface 218 and a second surface 220 opposite the first surface 218. In the illustrated embodiment, the first surface 218 is spaced from the substrate 202 and faces away from the substrate 202 while the second surface 220 is proximate the first surface 204 of the substrate 202 and faces the substrate 202. The first die 214 further includes a contact 222, wherein the contact 222 is preferably between the first and second surfaces 218, 220 of the die 214. A surface 224 of the contact 222 is coplanar with the first surface 218 of the die 214. In other embodiments, the contact 222 is on the first surface 218 of the die 214.

In one embodiment, the first die 214 is a VCSEL or LED die, as described herein. In further embodiments, the first die 214 is another type of light emitting die. Alternatively, the first die 214 may instead be a photodiode die, as described herein, or some other type of photodetector or light receiving die. Further, while FIG. 6B illustrates only two die 214 coupled to the substrate 202, it is to be appreciated that FIG. 6B is a simplified view of the assembly process and as such, in actuality, there may be hundreds, thousands, or even tens of thousands of die 214 on the substrate 202 during assembly. In some embodiments, some of the die 214 on the substrate 202 may be light-emitting die, such as VCSEL or LED die, while others of the die 214 on the substrate 202 may be light receiving or light sensing die, such as photodiode die or the like.

Figure 6C:
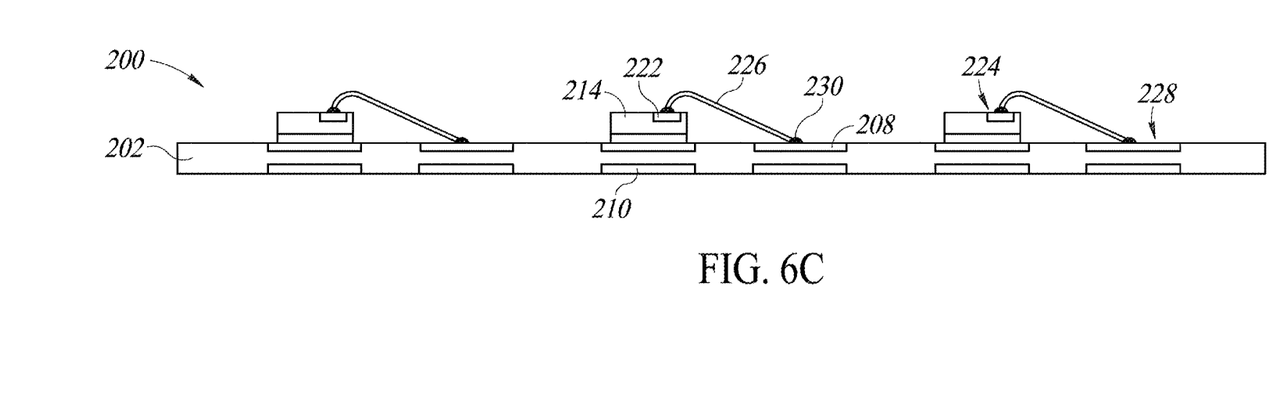

The method continues in FIG. 6C with wire bonding to electrically connect the die 214 to the substrate 202. More specifically, a wire 226, which may be any type of wire described above with respect to wire 180 (FIG. 4), is coupled between the contact 222 on each die 214 and one of the first plurality of contacts 208 of the substrate 202. In one embodiment, the wire bonding process includes coupling the wires 226 to the surface 224 of the contact 222 and a surface 228 of the first plurality of contacts 208 with solder 230. As shown in FIG. 6C, there is only one wire 226 coupled between each die 214 and the substrate 202. In other embodiments, there may be multiple wires 226 coupled between each die 214 and the substrate 202 during the wire bonding process. Further, the substrate 202 includes traces or vias through the substrate 202 to electrically connect the first plurality of contacts 208 to corresponding ones of the second plurality of contacts 210, as described above with reference to FIG. 3. As such, each die 214 is electrically connected to one of the first plurality of contacts 208 by the wire 226 and to one of the second plurality of contacts by traces through the substrate 202. During a board level assembly process, the die 214 can then be electrically connected to a PCB or other board level substrate by the second plurality of contacts 210.

Figure 6D:
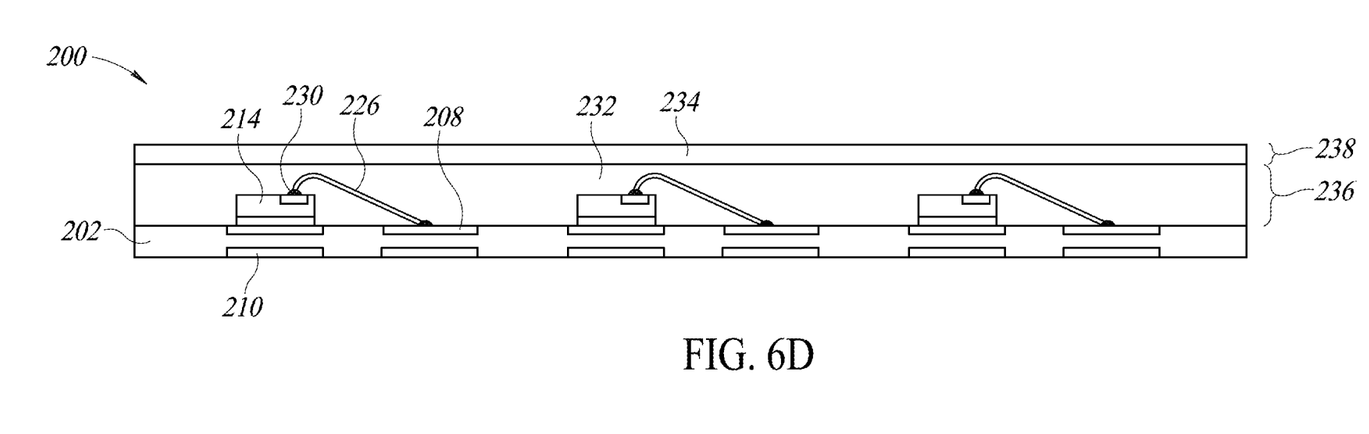

In FIG. 6D, a transparent resin 232 is deposited on the first die 214, the wire 226, the solder 230, the substrate 202, and the first plurality of contacts 208. The transparent resin 232 may be an epoxy resin that is cured in place, although in other embodiments, the transparent resin 232 is some other type of available transparent material. The transparent resin 232 is preferably deposited as a single, homogenous, continuous layer encapsulating the first dies 214, the wires 226, the solder 230, the substrate 202, and the first plurality of contacts 208. After curing the transparent resin 232, a filter 234 is formed on the transparent resin 232. As such, the transparent resin 232 protects the die 214 while also serving as a base or substrate layer for the filter 234. As will be described below, the transparent resin 232 and the filter 234 allow for elimination of the cap and cavity of typical cavity type optical sensor packages, which reduces package dimensions without affecting performance.

The filter 234 may be an infrared filter that is either formed as a single, continuous, homogenous layer on the transparent resin 232 or as a pre-formed sheet of material that is placed on the transparent resin 232 and coupled to the transparent resin 232. Where the filter 234 is an infrared filter, the infrared filter can include one or more of Potassium Bromide, Sodium Chloride, Magnesium Fluoride, Calcium Fluoride, Sapphire, Zinc Sulfide, Zinc Selenide, UV Fused Silica, Borosilicate Crown glass (N-BK7), Silicon, or Germanium, among others. In general, however, the filter 234 protects the die 214 while also improving optical performance. The material for the filter 234 can be selected according to desired properties for an application of the die 214, including divergence, thermal properties (e.g. coefficient of thermal expansion), transmission, and index of refraction. Other embodiments do not include the filter 234, such as in FIG. 7, and instead include only the transparent resin 232, which allows for even thinner packages to be formed. A thickness 236 of the transparent resin 232 may be greater than a thickness 238 of the filter 234, although the same is not required. In other embodiments, the thicknesses 236, 238 are the same while in yet further embodiments, the thickness 238 of the filter 234 is greater than the thickness 236 of the resin 232.

Figure 6E:
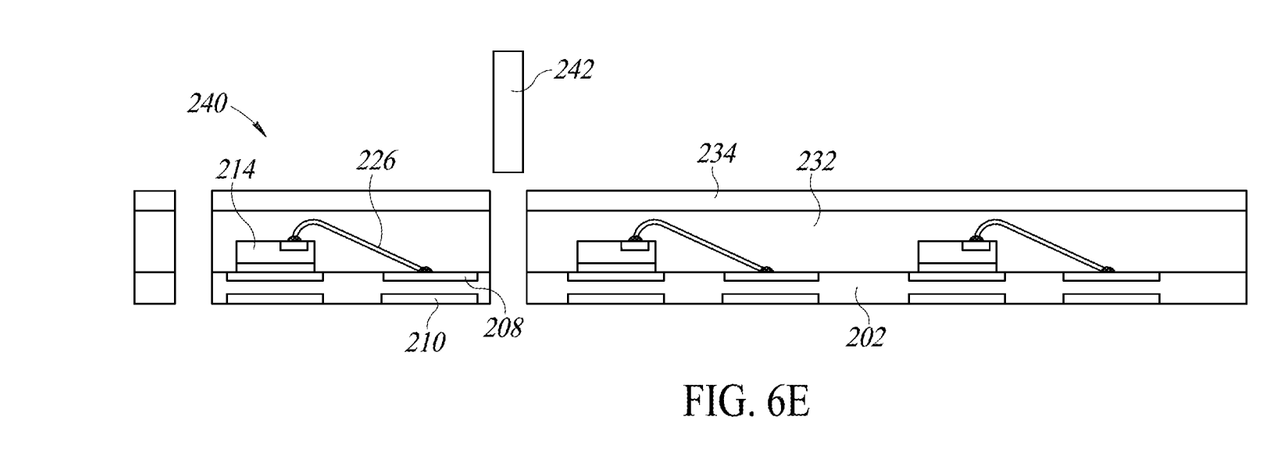

In FIG. 6E, the substrate 212, the transparent resin 232, and the filter 234 are separated into a first type of assemblies 240. Separation includes cutting with a mechanical blade 242, in an embodiment. Before cutting with the mechanical blade 242, cutting locations on the filter 234 may be marked with a laser to improve cutting accuracy. In other embodiments, separation includes cutting with a laser. Each assembly 240 includes one die 214, one wire 226, and a portion of the substrate 202 with four contacts 208, 210, and more specifically, two of the first plurality of contacts 208 and two of the second plurality of contacts 210 that correspond to the two first plurality of contacts 208.

Although FIGS. 6A-6E illustrate one or more embodiments of an assembly process for a first type of assembly 240, which may be either a light emitting or a light receiving assembly depending on the characteristics of the die 214 in the assembly 240, it is to be appreciated that the process in FIGS. 6A-6E can be repeated, or performed simultaneously, to produce a second type of assembly 244. In other words, in one embodiment, the process in FIGS. 6A-6E is performed to produce the assemblies 240, which are similar to the first assembly 106 (FIG. 2) and include a light emitting die 214, such as a VCSEL or an LED die. The method 200 includes the same process described with reference to FIGS. 6A-6E to produce a plurality of second assemblies 244, which are similar to the second assembly 108 and include a photodiode die 246 (or some other type of light detecting die), as shown in FIG. 6F.

Figure 6F:
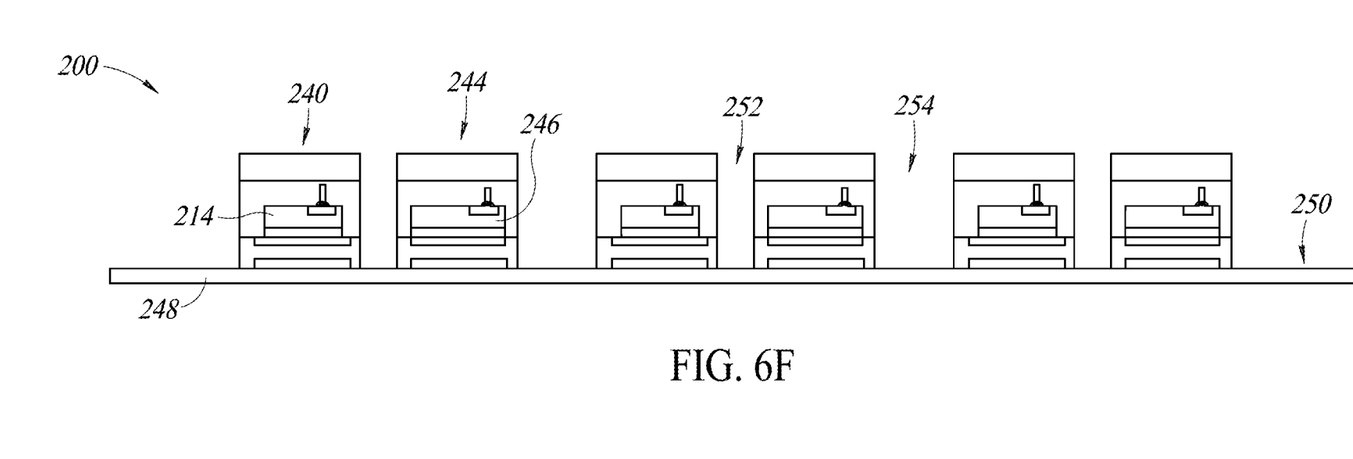

The method 200 continues in FIG. 6F by arranging the first assemblies 240 and the second assemblies 244 in an alternating fashion on a carrier, such as a tape 248. The tape 248 has an adhesive on a surface 250 facing the assemblies 240, 244 such that the assemblies 240, 244 are secured in place on the tape 248 for further processing. The assemblies are arranged in spaced relationship on the tape 248 with a first space 252 between the first assembly 240 and the second assembly 244 and a second space 254 between the second assembly 244 and an adjacent first assembly 240. The spaces 252, 254 can be selected according to design preference. In other words, a distance between adjacent assemblies 240, 244 can be selected to produce a thicker or thinner portion 138 of resin 110 (FIG. 2) between the assemblies 240, 244, among other characteristics.

Figure 6G:
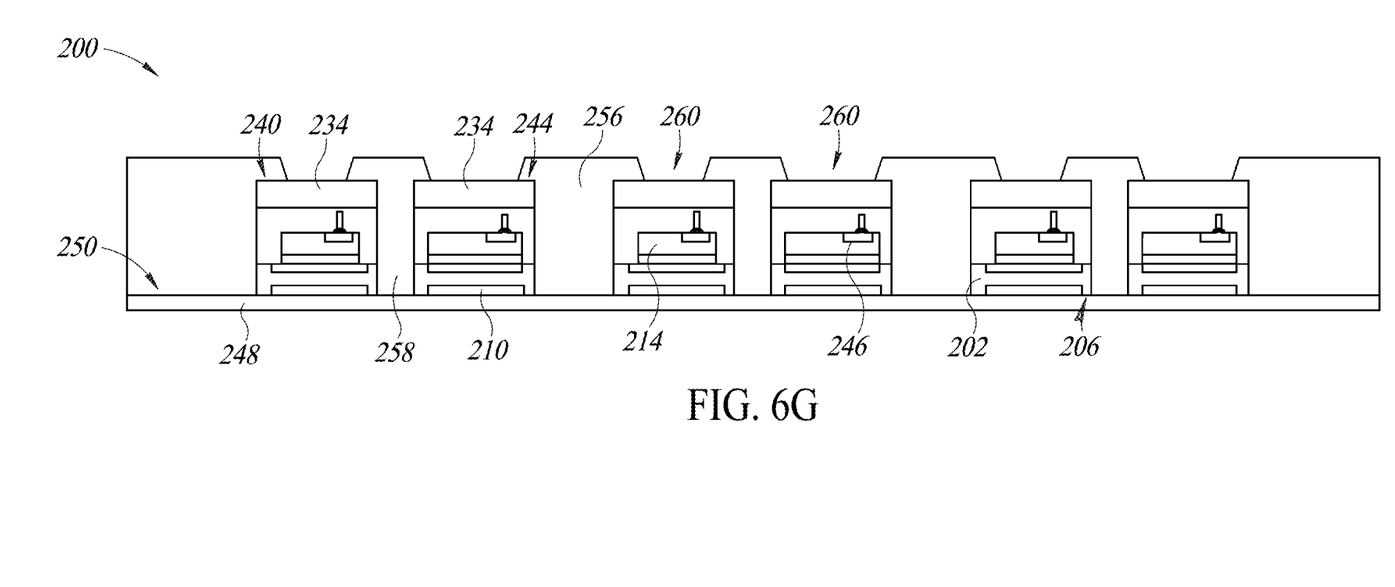

In FIG. 6G, a resin 256, which may be the same as or similar to resin 110 (FIG. 2) is formed on the assemblies 240, 244 and the tape 248. The resin 256 is on the surface 250 of the tape 248 facing the assemblies 240, 244 wherein the adhesive on the surface 250 of the tape 248 is in sealing contact with a surface of the assemblies 240, 244 containing the second contacts 210 to prevent the resin from contacting the second contacts 210 of each assembly 240, 244. Moreover, the resin 256 is on the tape 248, which is coplanar with the second surface 206 of the substrate 202, and as such, the resin 256 is formed coplanar with the second surface 206 of the substrate 202 as well. The resin 256 is preferably applied as a single, homogenous, continuous layer on the assemblies 240, 244, with a portion 258 of the resin extending between and in contact with the assemblies 240, 244 to couple the assemblies 240, 244 together. Further, the resin 256 may be opaque or is otherwise formed of material configured to prevent or impede transmission of light, such that the portion 258 between adjacent assemblies 240, 244 acts as a shield to block light emitted from the first assembly 240 from passing internally to the second assembly 244.

After the resin 258 is deposited, apertures 260 are formed extending through the resin 258 and aligned with the die 214, 246. The apertures 260 are formed by a mold with a selected pattern of protrusions corresponding to locations of the die 214, 244. The mold is pressed into the resin 258, the resin 258 is cured, and the mold is removed, which leaves the apertures 260 through the resin 258 in locations corresponding to the protrusions of the mold. The drop down angle of the mold results in sidewalls of the resin 258 around the apertures 260 being at an angle to horizontal that is between 10 and 20 degrees, in an embodiment. In other embodiments, the angle to horizontal is as low as 5 or less degrees, as described herein. In one or more embodiments, after the mold is released, a cleaning operation is performed to remove any resin 258 on portions of the filter 234 exposed by the apertures 260.

Figure 6H:
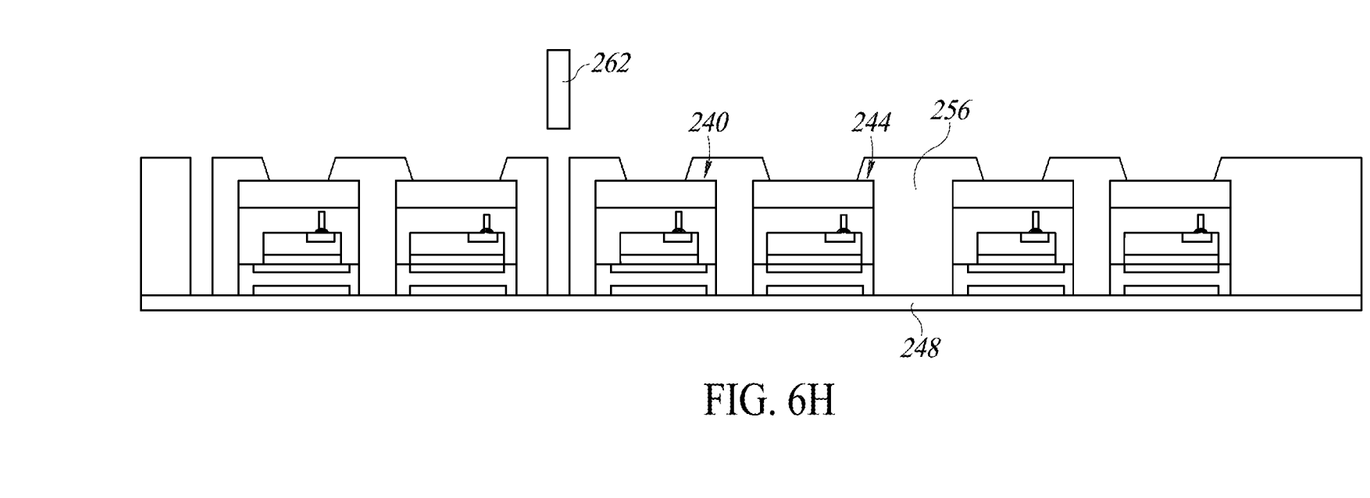
Figure 6I:
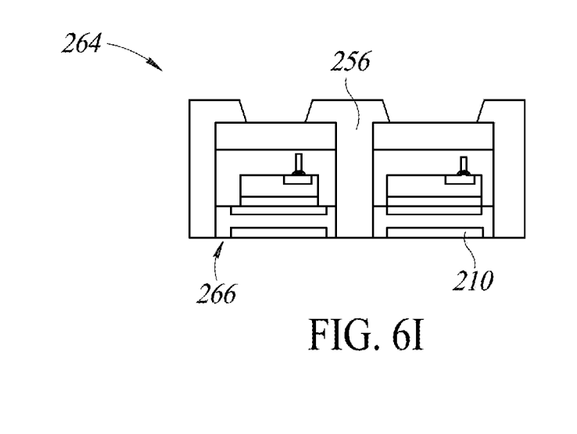

With reference to FIGS. 6F, 6H and 6I, the resin 256 and the tape 248 are separated in regions corresponding to the second space 254 between adjacent second assemblies 244 and first assemblies 240 with a mechanical blade 262, or a laser to produce packages 264. As shown in FIG. 6I, after separation, the tape 248 is removed, leaving contacts 210 exposed on an outer surface 266 of each package 264. Further, each package 264 includes one first assembly 240 and one second assembly 244 coupled together by the resin 256. The packages 264 are identical to the package 100 described with reference to FIGS. 1-5, in an embodiment.

Although FIGS. 6A-6I describe one or more embodiments of an assembly process for optical sensor packages, such as package 100 or 264, it is to be understood that the assembly process described herein can be used with any number of different types of semiconductor packages and semiconductor die. For example, in other embodiments, the process described above is used for formation of packages including microelectromechanical systems ("MEMS") type packages, among others. Further, while the packages 100, 264 have been described with only two assemblies with specific types of die, other embodiments include only one assembly, or three, four, five, six, or more assemblies, each with the same or different types of die as part of the final package 100, 264. Moreover, while the assemblies are generally described herein as including one die, it will be readily appreciated that in some embodiments, a plurality of die may be included in a single assembly, such as in a stacked configuration or positioned side-by-side, or any other configuration. As such, the present disclosure is not limited specifically to the embodiments shown in the drawings, but rather, can be applied to other semiconductor packages and associated die as well.

Figure 7:
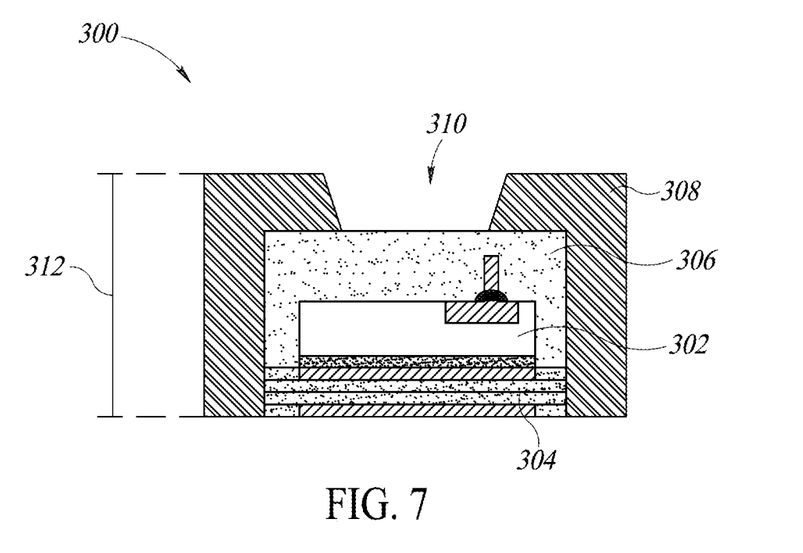
FIG. 7 is a cross-sectional view of an alternative embodiment of a sensor package according to the present disclosure illustrating a single assembly encapsulated by resin

FIG. 7 illustrates an alternative embodiment 300 of a semiconductor package 300. The semiconductor package 300 is similar to the packages 100, 264 except as otherwise provided below. The package 300 includes a semiconductor die 302, which may be a light emitting die, a light receiving die, a MEMS device, or some other semiconductor device, on a substrate 304. A transparent resin 306 is on the die 302 and the substrate 304 and a molding compound or encapsulant 308 is on the transparent resin 306. An aperture 310 extends through the encapsulant 308 to expose the transparent resin 306. As shown in FIG. 7, there is no filter on the transparent resin between the encapsulant 308 and the transparent resin 306. As such, the package 300 may be even thinner than packages 100, 264, as removing the filter reduces a thickness 312 of the package 300 compared to packages 100, 264 with the filter. Moreover, the package 300 includes only a single die 302 as compared to the packages 100, 264, which include multiple die. As such, the package 300 may be a MEMS device or a straight line optical sensor, for example.

Figure 8:
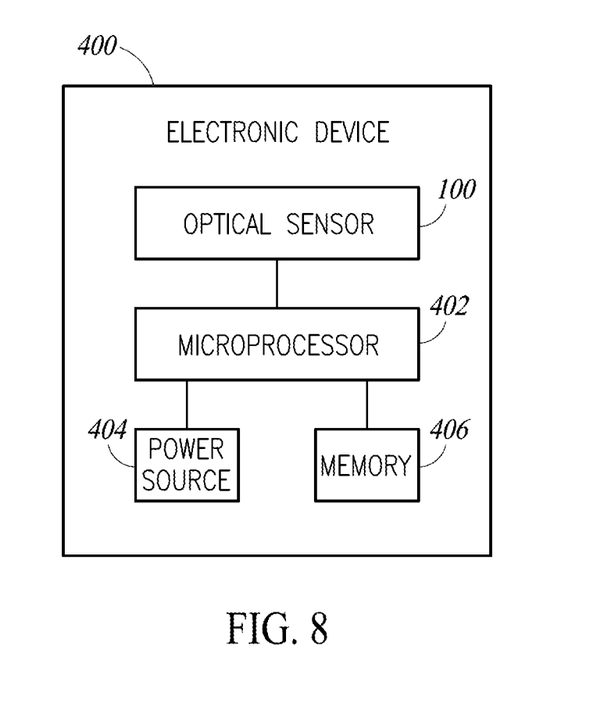
FIG. 8 is a schematic representation of an embodiment of an electronic device according to the present disclosure including an optical sensor package.

FIG. 8 illustrates an electronic device 400 including an optical sensor package, such as the optical sensor package 100 or 300, coupled to a microprocessor 402. The microprocessor 402 may be any circuit configured to receive or send electrical signals to the optical sensor package 100. The electronic device 400 may further include a power source 404 configured to provide electric power to the device 400, including the microprocessor 402 and the optical sensor package 100. The power source 404 may be a battery, for example. More specifically, the power source 404 may be a rechargeable or replaceable battery in some embodiments. The electronic device 400 may also include a memory 406 coupled to or incorporated in the microprocessor 402.

The memory 406, which may also be referred to herein as a non-transitory storage medium, may store instructions and/or data used by the microprocessor 402. The instructions as executed by the microprocessor 402 may execute logic to perform the functionality of the various embodiments of the optical sensor packages described herein, including, but not limited to, detecting a position or distance of an object relative to the packages 100, 300. In other words, instructions stored in the memory 406 configure, when executed, the microprocessor 402 to perform the functions of the package 100, 300, such as to process and act on information received from the die 146, 154 to detect a position of an object relative to the package 100.

In one or more embodiments, the electronic device 400 may be a cell phone, smart phone, tablet, camera, and/or wearable computing device that may be located in clothing, shoes, watches, glasses or any other wearable structures. The electronic device 400 may also be located in a vehicle or other mobile system or machinery, such as a vehicle, a boat, or a robot.

As such, the embodiments of the present disclosure provide a semiconductor package with resin replacing the cap and cavity of known packages, which has several advantages over known products. First, elimination of the cap and cavity allows for reduction in a size of the package in terms of length, width, and height or thickness, which increases the number of applications in which the packages described herein can be used. Second, elimination of the cap removes the cap to substrate gluing interfaces that can lead to package failure during repeated use cycles. Because the packages described herein do not include a cavity, the packages are stiffer and more resilient to outside forces than known cavity type packages. The assembly processes described herein also eliminate inefficiencies associated with the gluing processes for known cavity type packages with a cap, which reduces cost.

In the above description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with semiconductor devices and packages, such as optical sensor packages, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense that is as meaning "and/or" unless the content clearly dictates otherwise.

The relative terms "approximately" and "substantially," when used to describe a value, amount, quantity, or dimension, generally refer to a value, amount, quantity, or dimension that is within plus or minus 5% of the stated value, amount, quantity, or dimension, unless the context clearly dictates otherwise. It is to be further understood that any specific dimensions of components or features provided herein are for illustrative purposes only with reference to the exemplary embodiments described herein, and as such, it is expressly contemplated in the present disclosure to include dimensions that are more or less than the dimensions stated, unless the context clearly dictates otherwise.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a first assembly including:
      a first substrate;
      a first die on the first substrate; and
      a transparent material on the first die;
   a second assembly including:
      a second substrate;
      a second die on the second substrate;
      a contact in the second die;
      a contact pad in the second substrate; and
      a wire coupled between the contact and the contact pad;
   an encapsulant on the first assembly and the second assembly, the encapsulant including a portion extending between the first assembly and the second assembly and coupled to the first assembly and the second assembly, the encapsulant is between and separates the first substrate and the second substrate;
   a first aperture through the encapsulant and aligned with the first assembly; and
   a second aperture through the encapsulant and aligned with the second assembly.

2. The device of claim 1 wherein the first assembly further includes an infrared filter on the transparent material on the first die between the encapsulant and the transparent material on the first die.

3. The device of claim 1 wherein the second assembly further includes the transparent material on the second die.

4. The device of claim 3 wherein the second assembly further includes an infrared filter on the transparent material on the second die between the encapsulant and the transparent material on the second die.

5. The device of claim 1 wherein the first substrate of the first assembly includes a first surface and a second surface opposite the first surface, the encapsulant coplanar with the second surface of the first substrate.

6. The device of claim 1 wherein the first substrate of the first assembly includes a first surface and a second surface opposite the first surface, the transparent material on the first die between the first surface of the substrate and the encapsulant on the first assembly.

7. The device of claim 1 wherein the encapsulant further includes a first sidewall surface at least partially defining a boundary of the first aperture, the first sidewall surface being at an angle between 0 degrees and 90 degrees with respect to an upper surface of the first assembly.

8. The device of claim 7 wherein the encapsulant further includes a second sidewall surface at least partially defining a boundary of the second aperture, the second sidewall surface being at an angle between 0 degrees and 90 degrees with respect to an upper surface of the second assembly.

9. A method, comprising:
   forming a first plurality of contact pads in a first substrate;
   forming a first assembly on the first substrate, the forming the first assembly including:
      coupling a first die to the first substrate, the first die including a first contact;
      forming a first wire coupled between the first contact and one of the first plurality of contact pads; and
      forming a first transparent material on the first die and the first substrate;
   forming a second plurality of contact pads in a second substrate that is isolated from the first substrate;

forming a second assembly on the second substrate, the forming the second assembly including:
  coupling a second die to the second substrate, the second die including a second contact;
  forming a second wire coupled between the second contact and one of the second plurality of contact pads; and
  forming a second transparent material on the second die and the second substrate;
coupling the first assembly to the second assembly, including forming an encapsulant on the first assembly and the second assembly extending between the first assembly and the second assembly, including between the first substrate and the second substrate;
forming a first aperture through the encapsulant and aligned with the first assembly; and
forming a second aperture through the encapsulant and aligned with the second assembly.

10. The method of claim 9 wherein forming the first assembly further comprises:
  coupling a first filter to the first transparent material.

11. The method of claim 10 wherein forming the second assembly further comprises:
  coupling a second filter to the second transparent material.

12. The method of claim 9 wherein coupling the first assembly to the second assembly includes forming the encapsulant on a first surface of the first assembly and forming the encapsulant coplanar with a second surface of the first assembly opposite the first surface of the first assembly.

13. The method of claim 12 wherein coupling the first assembly to the second assembly includes forming the encapsulant on a first surface of the second assembly and forming the encapsulant coplanar with a second surface of the second assembly opposite the first surface of the second assembly.

14. The method of claim 13 wherein forming the first aperture through the encapsulant includes forming a first sidewall surface defining a boundary of the first aperture that is transverse with respect to the first surface of the first assembly.

15. The method of claim 13 wherein forming the second aperture through the encapsulant includes forming a second sidewall surface defining a boundary of the second aperture that is transverse with respect to the first surface of the second assembly.

16. A device, comprising:
a first intermediate package having a first surface and a second surface opposite the first surface, the first intermediate package including:
  a first substrate;
  a first die having a first surface on the first substrate and a second surface opposite the first surface;
  a first contact in the first die and coplanar with the second surface of the first die; and
  a first transparent resin layer on the first die;
a second intermediate package having a first surface and a second surface opposite the first surface of the second intermediate package, the second intermediate package including:
  a second substrate;
  a second die having a first surface on the second substrate and a second surface opposite the first surface of the second die;
  a second contact in the second die and coplanar with the second surface of the second die; and
  a second transparent resin layer on the second die; and
an encapsulant at least partially encapsulating the first intermediate package and the second intermediate package, the encapsulant coplanar with the second surface of the first intermediate package and the second surface of the second intermediate package, the encapsulant between the first substrate and the second substrate,
wherein a first aperture extends through the encapsulant over the first transparent resin layer and a second aperture extends through the encapsulant over the second transparent resin layer.

17. The device of claim 16, further comprising:
a first infrared filter on the first transparent resin of the first intermediate package; and
a second infrared filter on the second transparent resin of the second intermediate package,
wherein the encapsulant is on the first infrared filter and the second infrared filter, the first transparent resin of the first intermediate package disposed between the first infrared filter and the first die, and the second transparent resin of the second intermediate package disposed between the second infrared filter and the second die.

18. The device of claim 16 wherein the first intermediate package includes a sidewall extending between the first surface and the second surface of the first intermediate package, the encapsulant being on the first surface and the sidewall of the first intermediate package.

19. The device of claim 18 wherein the second intermediate package includes a sidewall extending between the first surface and the surface of the second intermediate package, the encapsulant being on the first surface and the sidewall of the second intermediate package.

20. The device of claim 16 wherein the first aperture is smaller than the second aperture.

* * * * *